(12) United States Patent
Syu et al.

(10) Patent No.: US 12,051,521 B2
(45) Date of Patent: Jul. 30, 2024

(54) FLEXIBLE TRANSPARENT CONDUCTIVE COMPOSITE FILM AND MANUFACTURING METHOD THEREOF

(71) Applicant: FENG CHIA UNIVERSITY, Taichung (TW)

(72) Inventors: Jia-Lin Syu, Mailiao Township, Yunlin County (TW); Ying-Hung Chen, Taichung (TW); Ping-Yen Hsieh, Tainan (TW); Chu-Liang Ho, Taichung (TW)

(73) Assignee: FENG CHIA UNIVERSITY, Taichung (TW)

( * ) Notice: Subject to any disclaimer, the term of this patent is extended or adjusted under 35 U.S.C. 154(b) by 0 days.

(21) Appl. No.: 17/551,175

(22) Filed: Dec. 14, 2021

(65) Prior Publication Data
US 2022/0199282 A1    Jun. 23, 2022

(30) Foreign Application Priority Data
Dec. 19, 2020   (TW) ................. 109145192

(51) Int. Cl.
| | | |
|---|---|---|
| C23C 14/08 | (2006.01) | |
| C23C 14/20 | (2006.01) | |
| C23C 14/35 | (2006.01) | |
| H01B 1/02 | (2006.01) | |
| H01B 1/08 | (2006.01) | |

(52) U.S. Cl.
CPC ............. *H01B 1/08* (2013.01); *C23C 14/08* (2013.01); *C23C 14/20* (2013.01); *C23C 14/352* (2013.01); *H01B 1/02* (2013.01)

(58) Field of Classification Search
CPC ........... H01B 1/08; C23C 14/08; C23C 14/20; C23C 14/352
See application file for complete search history.

(56) References Cited

U.S. PATENT DOCUMENTS

| | | | | |
|---|---|---|---|---|
| 10,510,457 | B2 * | 12/2019 | Shingai | .................... H01B 1/02 |
| 2012/0118377 | A1 * | 5/2012 | Shin | ....................... H10K 30/15 |
| | | | | 136/259 |
| 2012/0125423 | A1 * | 5/2012 | Krisko | .................. H01L 31/073 |
| | | | | 257/E31.015 |
| 2013/0059155 | A1 * | 3/2013 | Choi | ....................... C23C 28/04 |
| | | | | 977/734 |
| 2014/0174640 | A1 * | 6/2014 | Wenxu | ..................... B29C 67/24 |
| | | | | 156/155 |

(Continued)

FOREIGN PATENT DOCUMENTS

| | | |
|---|---|---|
| CN | 103608872 A | 2/2014 |
| CN | 104701344 A | 6/2015 |

(Continued)

*Primary Examiner* — Jaehwan Oh
(74) *Attorney, Agent, or Firm* — Cheng-Ju Chiang (57) ABSTRACT

The invention discloses a flexible transparent conductive composite film and the manufacturing method thereof. The aforementioned flexible transparent conductive composite film is formed by depositing the first target material and the second target material in an alternating manner by HiPIMS. Therefore, the post-anneal step of the traditional method can be omitted, and the manufacturing efficiency of the flexible transparent conductive composite films is significantly improved.

6 Claims, 7 Drawing Sheets

(56) References Cited

U.S. PATENT DOCUMENTS

| | | | | |
|---|---|---|---|---|
| 2015/0144199 A1* | 5/2015 | Huh | H01G 9/2031 | 438/85 |
| 2016/0020413 A1* | 1/2016 | Tamayo | H10K 30/30 | 136/263 |
| 2016/0141434 A1* | 5/2016 | Chang | H01L 21/02477 | 438/95 |
| 2016/0147125 A1* | 5/2016 | Theodore | C23C 14/185 | 349/33 |
| 2016/0215394 A1* | 7/2016 | Sung | H10K 85/10 | |
| 2017/0159169 A1* | 6/2017 | Chen | H01J 37/3491 | |
| 2018/0197649 A1* | 7/2018 | Shingai | C23C 14/08 | |

FOREIGN PATENT DOCUMENTS

| | | | |
|---|---|---|---|
| KR | 20170026730 A | * | 8/2015 |
| KR | 20180035478 A | * | 4/2018 |
| TW | 200617998 A | | 6/2006 |

* cited by examiner

FIG. 7

FLEXIBLE TRANSPARENT CONDUCTIVE COMPOSITE FILM AND MANUFACTURING METHOD THEREOF

TECHNICAL FIELD

The present invention is specifically related to a flexible transparent conductive composite film and the manufacturing method thereof.

BACKGROUND OF RELATED ARTS

The traditional transparent conductive film comprises an ITO layer which is formed by RF/DC magnetron sputtering method on a transparent substrate. Therefore, the conductivity and flexibility are limited by the characteristic of the monolayer film. However, the needs of the transparent conductive film increase significantly while the various types of products are increasing and the traditional monolayer transparent conductive film no longer satisfies the needs of market.

The transparent conductive composite film structure is commonly used for solving the abovementioned problems. For instance, the graphene material, conductive polymer material, silver nanowire or the other metal materials may be used to form the composite film layers. In fact, the RF/DC magnetron sputtering method is still used for depositing the layers of film when the material type and characteristic are different. The multiple layer structure performs the excellent conductivity, flexibility and transparency which are required by the industries.

However, the performance of composite structure is still restricted by the characteristic of each deposited material per se. For example, the flexibility performance of the conductive polymer material is theoretically great, however the conductivity is barely satisfactory. Moreover, the silver nanowire performs a good transparency, flexibility and conductivity, however the silver nanowire exhibits high rough and haze properties, failing to perform the original characteristics and therefore interferes the transparency of the whole film. On the other hand, the optical reflectivity will be raised when the film comprises metal material, and the ultrathin form may easily aggregate. This phenomenon decreases the transmittance and conductivity of the deposited layer.

SUMMARY

To resolve the drawbacks of the prior arts, the present invention discloses a flexible transparent conductive composite film and the manufacturing method thereof. The aforementioned flexible transparent conductive composite film performs high optical transmittance, flexibility and low sheet resistance which represent the advantages of the current composite film. Specifically, the present invention forms the first target material and the second target material in an alternating manner via High-power Impulse Magnetron Sputtering (HiPIMS), thus the annealing process can be omitted and increase the efficiency of manufacturing the composite film.

At least one embodiment of the present invention is a flexible transparent conductive composite film which is formed by HiPIMS. A multilayer structure is sputtered and deposited on a transparent substrate. The multilayer structure is deposited by a conductive layer and a metal layer in an alternating manner, and the first layer and the last layer of the multilayer structure are the conductive layer.

The present invention further provides a manufacturing method of flexible transparent conductive composite film. The aforementioned manufacturing method needs to provide by using a HiPIMS system. First of all, the method introduces a background gas which is composed of $O_2$, Ar or combinations thereof, and sputters to deposit a first target material on the transparent substrate, forming a conductive layer. After the former steps, this method further introduces the Ar gas and sputters to deposit a second target material on the conductive layer, forming a metal layer, then keeps repeating the abovementioned steps until the multilayer structure has been formed. At last, the flexible transparent conductive composite film will be finished. The flexible transparent conductive composite film which is manufactured via the HiPIMS will perform high optical transmittance, flexibility and low sheet resistance.

The purpose of the present invention is to provide a flexible transparent conductive composite film which is manufactured via the HiPIMS to form the first target material and the second target material in an alternating manner via, thus the annealing process can be omitted and increase the efficiency of manufacturing the aforementioned composite film.

Embodiments of the invention are illustrated by way of example, and not by way of limitation, in the figures of the accompanying drawings in which like reference numerals refer to similar elements.

DETAILED DESCRIPTION OF THE INVENTION

The present invention discloses a flexible transparent conductive composite film and the manufacturing method thereof.

Figure 1:
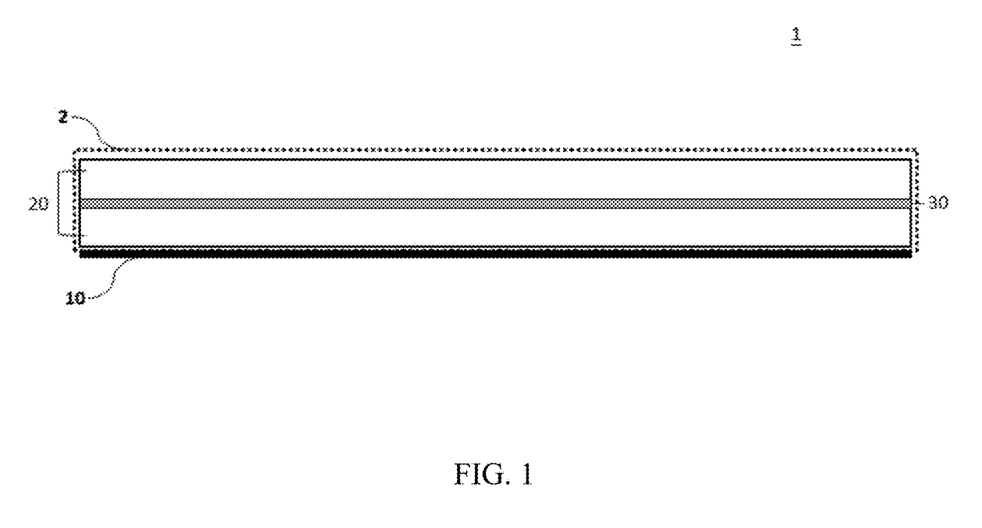
FIG. 1 is a schematic diagram of some embodiments of the present flexible transparent conductive composite film.
Figure 2:
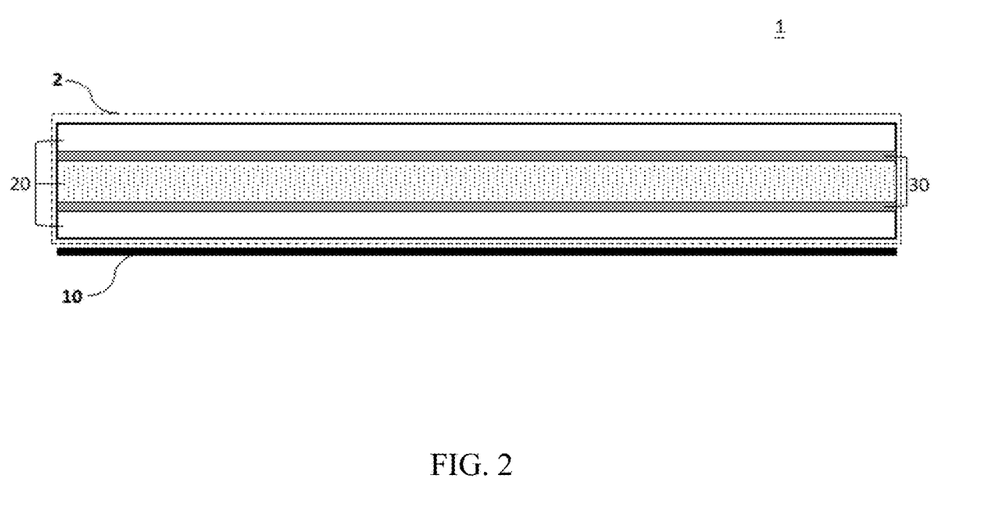
FIG. 2 is the other schematic diagram of some embodiments of the present flexible transparent conductive composite film.

Please refer to FIG. 1 and FIG. 2. The FIG. 1 and FIG. 2 are schematic diagrams of some embodiments of the present flexible transparent conductive composite film. The flexible transparent conductive composite film 1 is manufactured by forming multilayer structure 2 on transparent substrate 10 via the High-power Impulse Magnetron Sputtering (HiPIMS). In the instant embodiment, the multilayer structure 2 is constructed by a conductive layer 20 and a metal layer 30 which are in an alternating manner. Moreover, the first and the last layer of the multilayer structure 2 are the conductive layer 20. Please notice that the conductive layer 20 and metal layer 30 of the present invention is deposited on PET substrate via the certain condition HiPIMS at room temperature, therefore to form the multilayer structure 2. The aforementioned transparent substrate 10 is PET substrate, or the material may alternatively be the PEN, COP, flexible polymer material or flexible glass. Hence the transparent substrate 10 is also flexible, too.

The conductive layer 20 may be the transparent conductive metal oxides, such as ITO, AZO, GZO, IGZO, IZO or the combinations thereof. The metal layer 30 may be the high conductivity metal material, such as Au, Ag, Cu, Al, Ti or/and combination compounds thereof. On the other hand, the flexible transparent conductive composite film 1 is required to perform a high transmittance. Therefore, in the multilayer structure 2 of the present embodiment, the thickness of metal layer 30 which combines with the conductive layer 20 is preferred to be 20 nm or less. 10 nm or less (etc. 9 nm) may be the most recommended. The aforementioned thickness and material make the metal layer 30 transparent or nearly transparent. The former "high optical transmittance" means 75% or more optical transmittance.

As shown in FIG. 1 and FIG. 2, the number of layer of the multilayer structure 2 is odd number which is at least three layers (etc. 5 layers), and the first (top) and the last (bottom) layer are conductive layer 20. For instance, the number of layer of the multilayer structure 2 is manufactured as three, meaning that the conductive layer 20, metal layer 30 and conductive layer 20 is respectively formed on the transparent substrate 10. The other examples may be referred to such order and manufacturing method. When the number of layer of the multilayer structure 2 is five, which should be regarded as the three-layer structure, the conductive layer 20, metal layer 30, conductive layer 20, metal layer 30 and conductive layer 20 will be respectively formed. In other words, any conductive layer 20 of the multilayer structure 2 will thicker than the metal layer 30. Specifically, the conductive layer 20 as the middle layer (the third layer of five-layer structure) is configured to be the thickest layer between the first and the last conductive layer 20. As the three-layer structure shown in FIG. 1, the thickness of the conductive layer 20 approximately ranges from 30 nm to 50 nm, and the thickness of the metal layer 30 is approximately ranged from 10 nm to 20 nm. Furthermore, the five-layer structure as shown in FIG. 2, the thicknesses of the first and the last conductive layer 20 may be about 30 nm to 50 nm. The thickness of the middle conductive layer 20 is about 70 nm to 100 nm. The thickness of the metal layer 30 is about 5 nm to 20 nm.

Moreover, a person having ordinary skill in the present art should understand that the thicknesses of aforementioned conductive layer 20 and metal layer 30 are the preferred embodiment and the practical thickness may be adjusted for the transmittance or flexibility needs.

The High-power Impulse Magnetron Sputtering (HiPIMS) system works in "certain condition", therefore to form the multilayer structure 2 on the transparent substrate 10. The transparent substrate 10 is placed to a chamber, and a vacuum pump will remove the gas molecular inside the chamber (pressure: $1.7*10^{-2}$ Pa). After that, a background gas and sputtered target materials are introduced into the chamber. The conductive layer 20 and metal layer 30 will soon be deposited on the surface of transparent substrate 10 respectively. Hence, the flexible transparent conductive composite film 1 has been manufactured. Hereinafter, the "certain condition" comprises the compounds of background gas, material of target and the peak power density (W/cm$^2$). In the other possible embodiment, the "certain condition" may further comprise the degree of vacuum of the chamber, deposition rate, or temperature of the transparent substrate 10 and the chamber. The abovementioned certain conditions may decide the final thickness (nm), transmittance (%), sheet resistance (Ω) and the critical radius of curvature (mm) of the flexible transparent conductive composite film 1.

Figure 3:
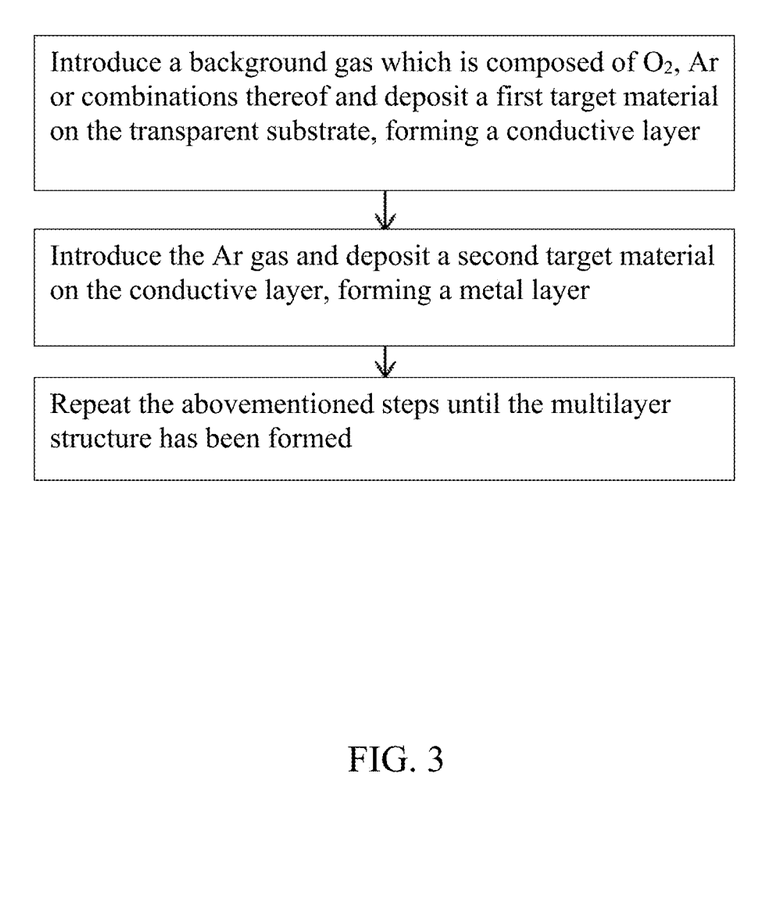
FIG. 3 is a manufacturing method flow chart of some embodiments of the present flexible transparent conductive composite film.

Please refer to FIG. 3. FIG. 3 is a manufacturing method flow chart of some embodiments of the present flexible transparent conductive composite film. The method features that: Introduce a background gas which comprises $O_2$ and Ar, and deposit a first target material onto the transparent substrate 10, forming the aforementioned conductive layer 20. The first target material comprises ITO, AZO, GZO, IGZO or IZO. After the former step, the Ar gas is further introduced and deposited a second target material onto the surface of conductive layer 20, therefore to form the aforementioned metal layer 30. The second target material comprises Au, Ag, Cu, Al or Ti. The present embodiment will repeat the described steps until the multilayer structure 2 has been completely formed.

To prove the capability and the reliability of FIG. 3, the present embodiment measures the flexible transparent conductive composite film which. The results (the first sample and the second sample) comprise the final thickness (nm), transmittance (%), sheet resistance (Ω) and critical radius of curvature (mm). The following description will be presented by TABLE 1, TABLE 2 and FIG. 4-FIG. 7 respectively.

Please refer to the following TABLE 1. The table 1 has shown every "certain condition" between every sample of the present embodiments. A person having ordinary skill in the art should understand that the type of material or the conditions is able to be changed with different needs; the present invention is not limited thereto.

TABLE 1

| HIPIMS coating parameter | | | |
| --- | --- | --- | --- |
| | Target material | | |
| | Ag | ITO ($In_2O_3$:Sn) | AZO (ZnO:Al) |
| Target size (cm × cm) | | 33.5 × 11.4 | |
| Power mode | | Unipolar | |
| Ar gas flow (sccm) | 47.6 | 43.9 | 45.1 |
| $O_2$ gas flow (sccm) | 0 | 2.4 | 1.6 |
| $O_2$/Ar gas flow ratio (%) | 0 | 5.5 | 3.5 |
| Working pressure (Pa) | | 0.17 | |
| Substrate rotate speed (rpm) | | 20 | |
| Discharge frequency (Hz) | 100 | | 200 |
| Pulse width (μs) | | 60 | |
| Peak voltage (V) | 1140 | 798 | 523 |
| Peak current (A) | 100 | 180 | 190 |
| Average power (kW) | 0.6 | 0.8 | 1.1 |

Please see FIG. 1, FIG. 2 and refer to TABLE 1. As shown in TABLE 1. The first target material of the first and the second sample is ITO or AZO, and the second target material is Ag. It is noticed that the $O_2$:Ar ratio of the background gas ranges from 0 to 0.1 (It means the pure Ar gas or 10 v % $O_2$ gas is mixed). As such, the peak power density during the sputtering process is at least 250 W/cm$^2$.

Figure 4:
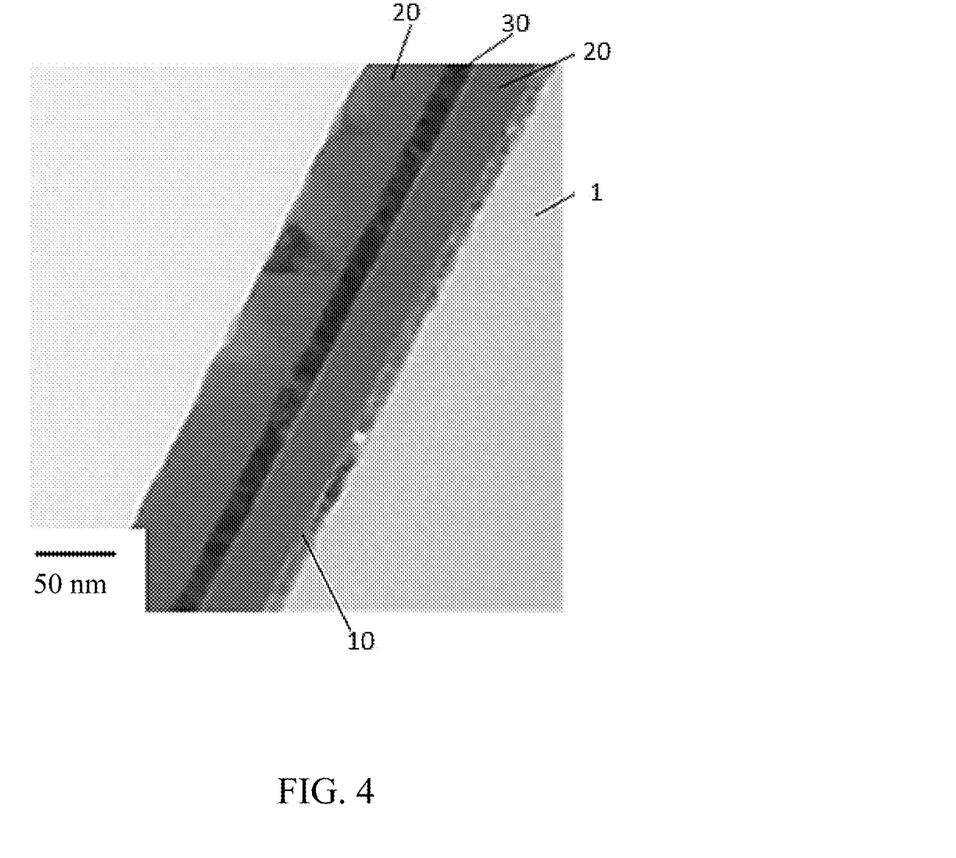
FIG. 4 is the electron micrograph of ITO/Ag/ITO structure of some embodiments of the present flexible transparent conductive composite film.

On the other hand, please refer to FIG. 1 and FIG. 4. FIG. 4 is the electron micrograph of ITO/Ag/ITO structure of some embodiments of the present flexible transparent conductive composite film. In the FIG. 1, the first sample is the three-layer multilayer structure 2 which is formed on transparent substrate 10. The three-layer multilayer structure 2 is formed and constructed by conductive layer 20 and metal layer 30 in an alternating manner via sputtering the first target material and the second target material respectively. The FIG. 4 illustrates that the thickness of the conductive layer 20 (ITO layer) of the first sample ranges from 30-50 nm, and the thickness of the metal layer 30 (Ag layer) ranges from 10-20 nm. The ITO layer and the Ag layer are formed in an alternating manner is observed. Therefore, the first sample performs that the 80% or higher transmittance, 5 Ω/sq or lower sheet resistance and 4 mm even lower critical radius of curvature.

Figure 6:
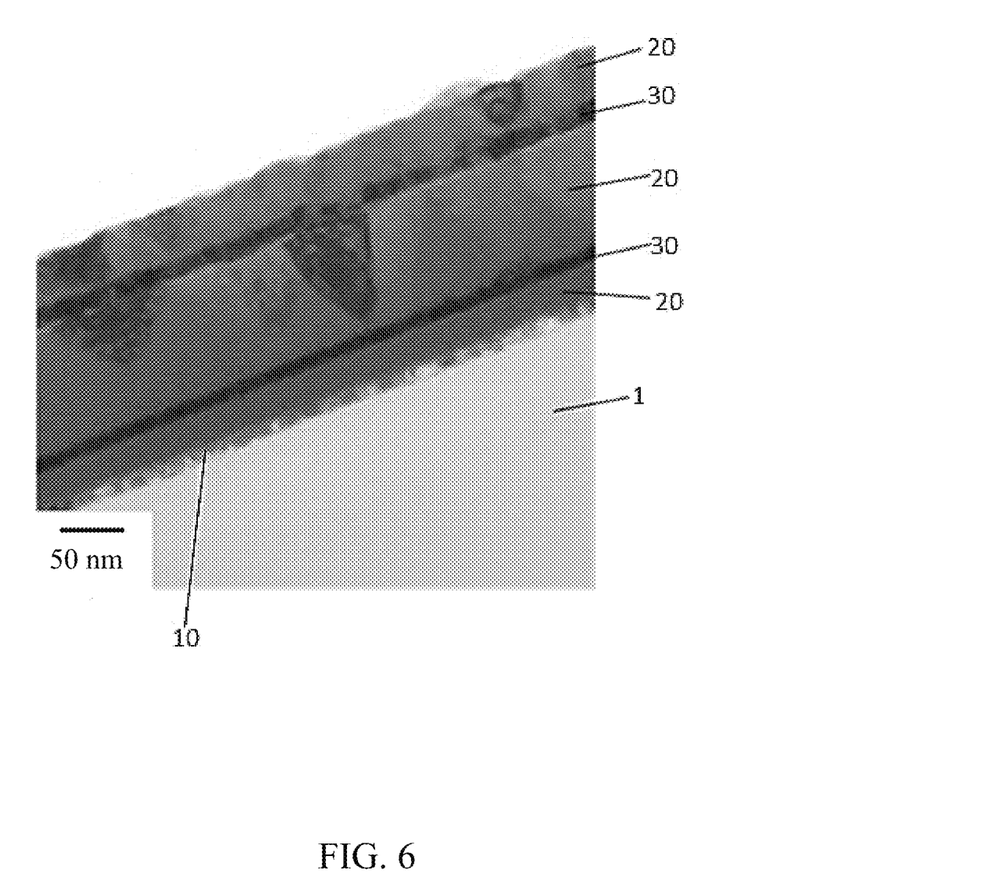
FIG. 6 is the electron micrograph of ITO/Ag/ITO/Ag/ITO structure of some embodiments of the present flexible transparent conductive composite film.

Furthermore, please see FIG. 2 and FIG. 6. FIG. 6 is the electron micrograph of ITO/Ag/ITO/Ag/ITO structure of some embodiments of the present flexible transparent conductive composite film. The second sample as shown in FIG. 2 illustrates that the five-layer multilayer structure 2 is formed on the surface of transparent substrate 10. As shown in FIG. 6 the first and the last conductive layer 20 is the ITO layer with the thickness between 30 nm and 50 nm. The middle conductive layer 20 is the ITO layer, too. However, the thickness of the middle layer ranges from 70-100 nm. On the other hand, the Ag layer is used for the metal layer 30 which has 10-20 nm thickness. The second sample of this embodiment shows 75% or higher transmittance, 3 Ω/sq or lower sheet resistance and 6 mm or lower critical radius of curvature.

Figure 5:
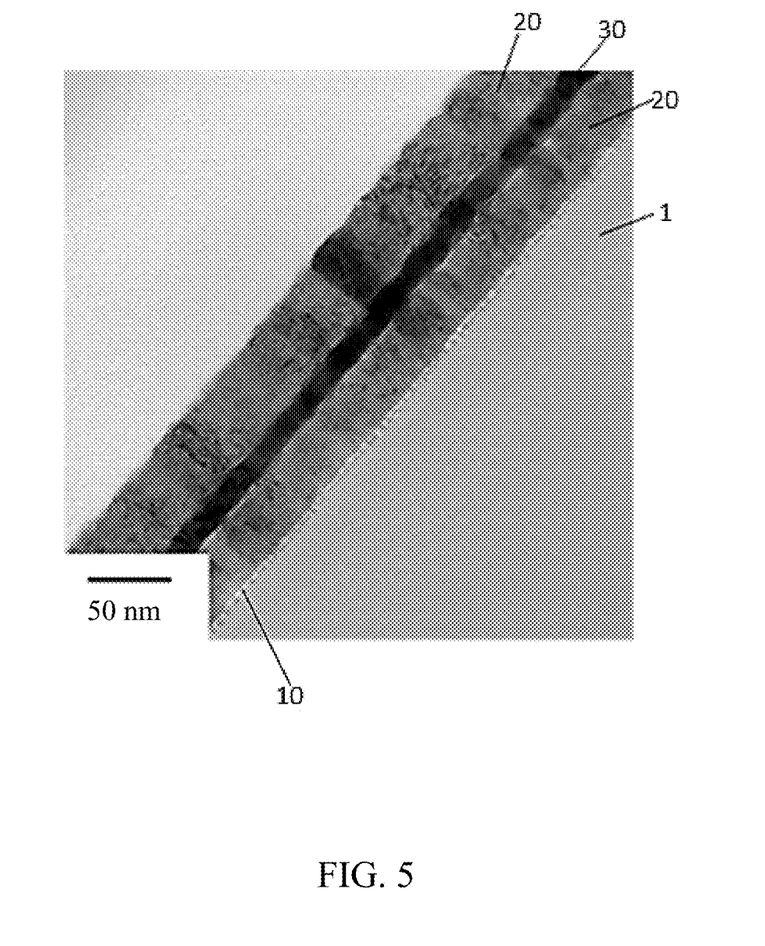
FIG. 5 is the electron micrograph of AZO/Ag/AZO structure of some embodiments of the present flexible transparent conductive composite film.
Figure 7:
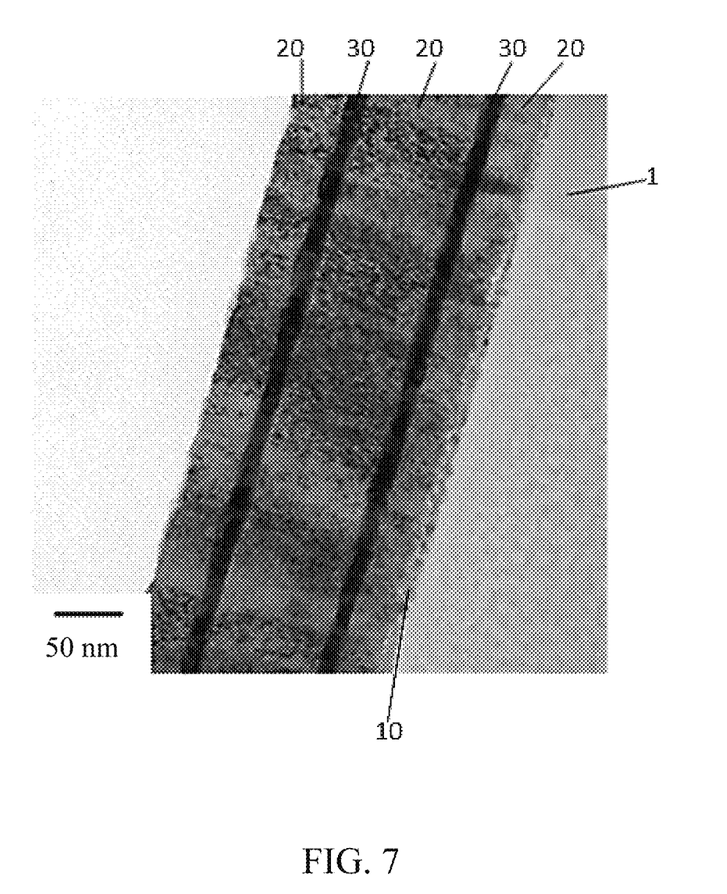
FIG. 7 is the electron micrograph of AZO/Ag/AZO/Ag/AZO structure of some embodiments of the present flexible transparent conductive composite film.

Please refer to FIG. 7 and FIG. 5 thereby referring to the following TABLE 2. The TABLE 2 shows every detected sheet resistance of every sample. FIG. 5 is the electron micrograph of AZO/Ag/AZO structure of some embodiments of the present flexible transparent conductive composite film. FIG. 7 is the electron micrograph of AZO/Ag/AZO/Ag/AZO structure of some embodiments of the present flexible transparent conductive composite film. Please notice that the variants of the first and the second sample have been shown in these figures thereon. In the variants of the first and second sample, as shown in the FIG. 5 (the variant of the first sample), the conductive layer 20 is an AZO layer and the thickness per se ranges from 30-50 nm. As shown in the FIG. 7 (the variant of the second sample), the conductive layers 20 are AZO layers (the first and the last layer), and the thickness per se ranges from 30-50 nm, however the thickness of the middle AZO layer ranges from 70-100 nm.

TABLE 2

|  | ITO/Ag/ITO | AZO/Ag/AZO | ITO/Ag/ITO/Ag/ITO | AZO/Ag/AZO/Ag/AZO |
|---|---|---|---|---|
| Sheet resistance (Ω/sq.) | 4.1 | 3.6 | 2.9 | 2.7 |

As understood by a person skilled in the art, the foregoing preferred embodiments of the present invention are illustrated of the present invention rather than limiting of the present invention. It is intended to cover various modifications and similar arrangements comprised within the spirit and scope of the appended claims, the scope of which should be accorded the broadest interpretation so as to encompass all such modifications and similar structure. While the preferred embodiment of the invention has been illustrated and described, it will be appreciated that various changes can be made therein without departing from the spirit and scope of the invention.

What is claimed is:

1. A flexible transparent conductive composite film, forming by HiPIMS and sputtering and depositing a multilayer structure on a transparent substrate;

wherein the multilayer structure is deposited by a conductive layer and a metal layer in an alternating manner, and first layer and last layer of the multilayer structure are the conductive layer;

wherein the HiPIMS supplies peak power density during the sputtering process is at least 250 W/cm$^2$;

wherein a critical radius of curvature of the flexible transparent conductive composite film is 4 mm and lower than 4 mm.

2. The flexible transparent conductive composite film as claimed in claim 1, wherein total layer number of the metal layer and the conductive layer is odd number.

3. The flexible transparent conductive composite film as claimed in claim 1, wherein thickness of the conductive layer is equal to or thicker than the metal layer.

4. The flexible transparent conductive composite film as claimed in claim 1, wherein material of the conductive layer comprises ITO, AZO, GZO, IGZO or IZO.

5. The flexible transparent conductive composite film as claimed in claim 1, wherein material of the metal layer comprises Au, Ag, Cu, Al or/and combination compounds thereof.

6. The flexible transparent conductive composite film as claimed in claim 2, wherein the total layer number is at least three.

* * * * *